SQUARE WAVE PULSE GENERATOR HAVING GOOD FREQUENCY STABILITY

Filed Nov. 21, 1961

INVENTOR.
MARTIN FISCHMAN
BY R. J. Frank
ATTORNEY 3,155,921

SQUARE WAVE PULSE GENERATOR HAVING GOOD FREQUENCY STABILITY

Martin Fischman, Wantagh, N.Y., assignor to General Telephone and Electronics Laboratories, Inc., a corporation of Delaware Filed Nov. 21, 1961, Ser. No. 153,947
4 Claims. (Cl. 331—117)

Figure 1:
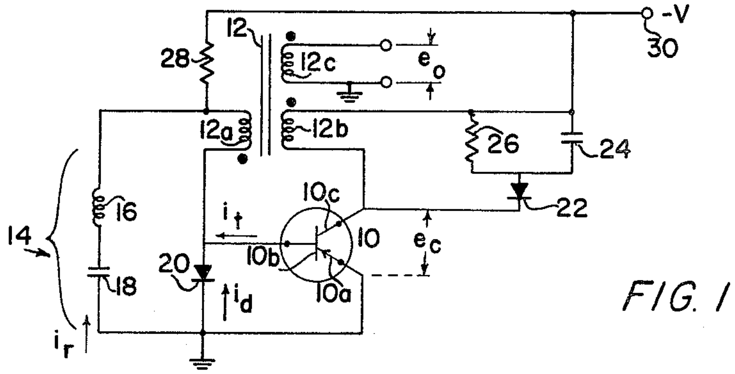

This invention relates to pulse oscillators and, in particular, to a frequency stable pulse oscillator.

Oscillators designed to generate pulses having steep leading and trailing edges find wide applications in television and other electronic apparatus. These know pulse oscillators are generally of the relaxation type in which the frequency is determined by resistance-capacitance or resistance-inductance networks. However, it has been found that relatively wide frequency variations occur in relaxation oscillators with changes in supply voltage, transistor characteristics due to environmental conditions, or loading and that these variations make them unsatisfactory for many purposes requiring high frequency stability. Accordingly, it is an object of my invention to provide an improved pulse oscillator having good frequency stability.

It is another object of my invention to provide a pulse oscillator in which the pulse duration is precisely equal to the interval between pulses.

Still another object is to provide a pulse oscillator in which the frequency of operation is substantially independent of the power supply voltage.

Yet another object is to provide a pulse oscillator in which the operating frequency is adjustable over wide limits.

A further object is to provide a pulse oscillator in which the transformer core need not have saturating characteristics.

A still further object is to provide a pulse oscillator capable of generating symmetrical square wave pulses having steep leading and trailing edges.

In the present invention, a pulse oscillator is provided which comprises a transistor having first, second, and third electrodes, a series resonant circuit, and a transformer having at least first and second windings. The period of oscillation is determined by the frequency of the resonant circuit. The first and second electrodes of the transistor, the first winding of the transformer and the series resonant circuit are coupled in series, while the second winding of the transformer is connected between the third electrode of the transistor and a source of voltage. Asymmetrically conducting means are coupled between the first and second electrodes of the transistor to provide a low impedance path for the current through the series resonant circuit during the entire cycle of oscillation. In addition, switching means, having a first high impedance state and a second low impedance state, are coupled across at least one of the transformer windings. The switching means maintains the impedance of the transformer winding connected in series with the resonant circuit at a low value during the portion of the cycle in which the transistor is non-conducting.

In one embodiment of the invention, the first, second, and third electrodes correspond to the emitter, base, and collector electrodes of the transistor respectively. The asymmetrically conducting means consists of a first diode connected between the emitter and base of the transistor, the emitter-base circuit acting as a diode poled in the opposite direction from that of the first diode. The switching means consists of a parallel resistance-capacitance network in series with a second diode, the second diode being poled so that it conducts during the half cycle that the transistor is non-conducting.

When the circuit is oscillating under steady state conditions, a large sinusoidal current circulates through the resonant circuit, the first winding of the transformer, and the parallel combination of the first diode and the emitter-base diode of the transistor. During one-half of the cycle, the first diode is driven into conduction by the sinusoidal current and during the other half of the cycle the emitter-base diode of the transistor is driven into conduction. Since the emitter-base diode conducts for exactly one-half cycle, the transistor is turned on for exactly a half cycle driving the transistor into saturation and producing a square wave voltage at the collector. The collector voltage is coupled from the second winding to the first winding of the transformer with a reversal of polarity thereby providing the drive for the series resonant circuit. The alternate conduction of the emitter-base diode and the first diode on successive half-cycles of sinusoidal oscillation produces the symmetrical square wave output.

In order to achieve high frequency stability, the resistances in series with the resonant circuit must be low. These resistances comprise the low resistance bilateral time-actuated switch, consisting of the emitter-base diode and the first diode, and the first winding of the transformer. When the transistor is conducting, the impedance reflected into the first winding of the transformer is low because of the shunting action of the low impedance emitter-collector path of the transistor. When the transistor is non-conducting, the second diode acts as an amplitude-actuated switch to provide a low impedance path across the second winding of the transformer.

Figure 2:
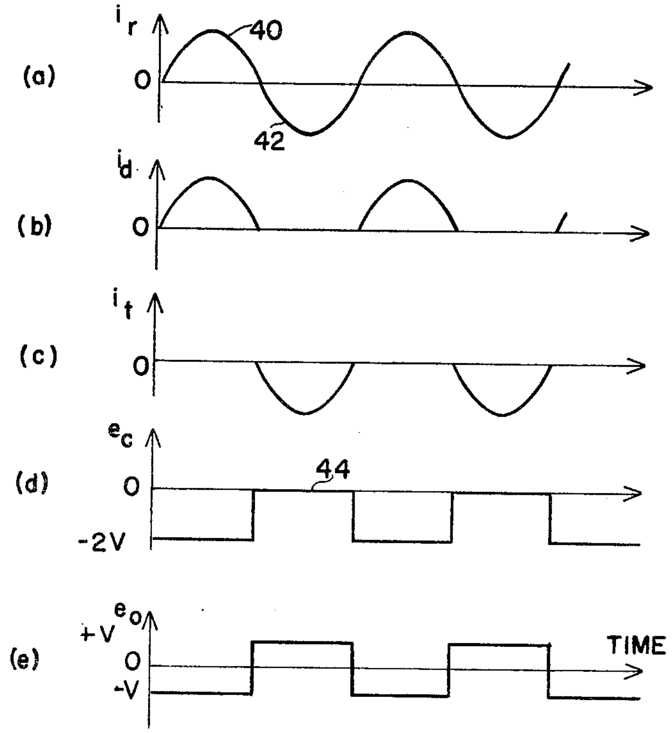

The above objects of and the brief introduction to the present invention will be more fully understood and further objects and advantages will become apparent from a study of the following description in connection with the drawings, wherein:

FIG. 1 is a schematic diagram of the pulse oscillator of the present invention; and FIG. 2 illustrates idealized voltage and current waveforms appearing in the current of FIG. 1.

Referring to FIG. 1, there is shown a pulse oscillator comprising a type PNP transistor 10 having an emitter electrode 10*a*, a base electrode 10*b*, and a collector electrode 10*c*. One end of the first winding 12*a* of a transformer 12 is connected to the base electrode 10*b* of the transistor and one end of the second winding 12*b* of the transformer is connected to the collector electrode 10*c*. A series resonant circuit 14, consisting of an inductance 16 and a capacitor 18, is connected between the other end of winding 12*a* of transformer 12 and the emitter 10*a* of transistor 10. A diode 20 is connected between the base electrode 10*b* and emitter electrode 10*a* of the transistor, diode 20 being poled so that current flow therethrough is from the base to the emitter electrode.

A switching network consisting of a diode 22 and a parallel connected capacitor 24 and resistor 26 is coupled across winding 12*b* of the transformer. Diode 22 is poled so that it conducts during the half cycle that transistor 10 is nonconducting. Starting voltage for the transistor is applied to the base electrode 10*b* through a resistor 28 and transformer winding 12*a* by a voltage source —V connected between a terminal 30 and the grounded emitter 10*a*. The collector electrode 10*c* is energized through winding 12*b* by supply voltage —V. Transformer winding 12*c* provides an electrically isolated output for the oscillator. The number of turns on winding 12*b* and the cross-sectional area of the transformer core are so selected that the transformer does not saturate under normal operating conditions.

Operation of the circuit may be best described by assuming that the oscillator has been operating for a sufficient number of cycles for the initial starting transients to have died down. Under these conditions, a large sinusoidal current $i_r$ (FIG. 2*a*) circulates in the series resonant circuit 14 driving diode 20 and the emitter-base diode of transistor 10 alternately into conduction on successive half cycles of the current $i_r$. On the first half cycle shown at 40 in FIG. 2*a*, transistor 10 is nonconducting and the current in the resonant circuit flows through diode 20 as shown in FIG. 2*b*. During this half cycle the diode current $i_d$ is substantially equal to $i_r$.

As a result of the current flow through winding 12*a*, the amplitude of the voltage across winding 12*b* increases causing diode 22 to conduct thereby switching capacitor 24 and resistor 26 across winding 12*b*. Since the combined impedance of diode 22 and capacitor 24 is low, the impedance reflected into winding 12*a* is also low. Thus, the impedance introduced by winding 12*a* in series with resonant circuit 14 is small and the resonant current $i_r$ is large.

At the start of the next half cycle 42 (FIG. 2*a*), the oscillating current $i_r$ is in the proper direction to cause current $i_t$ to flow through the emitter-base diode of transistor 10, diode 20 becoming non-conducting. Current begins to flow in the collector circuit producing positive feedback from the collector to the base of the transistor. The magnitude of the feedback and the gain of transistor 10 is sufficient to cause the transistor current to build up and rapidly enter the saturation region of the transistor characteristic. In this region, the collector current is independent of the base current, the transistor voltages remaining practically in an equilibrium state for a period of time due to the lack of dynamic gain under these conditions. This voltage equilibrium state corresponds to the "on" period of the oscillator in which the collector voltage 44 (FIG. 2*d*) increases to zero. During this portion of the cycle, the low impedance of the emitter-collector path of transistor 10 is effectively shunted across winding 12*b* thereby maintaining the input impedance of winding 12*a* low as in the previous half cycle. The transistor is then driven rapidly out of saturation by the operation of the resonant circuit resulting in a highly symmetrical square wave having precise on and off periods.

The collector voltage $e_c$, shown in FIG. 2*d*, swings between −2V during the half cycle that transistor 10 is nonconducting and zero during the half cycle that the transistor is conducting. Thus, the voltage across capacitor 24 is −V. The output voltage waveform $e_0$ (FIG. 2*e*) is identical to that of FIG. 2*d* except that its D.C. component is zero.

In a typical circuit, the values of the components are as follows:

| | |
|---|---|
| Transistor 10 | Type 2N428. |
| Diode 20 | Type 1N279. |
| Diode 22 | Type 1N279. |
| Inductance 16 | 1 millihenry. |
| Capacitor 18 | 270 micromicrofarads. |
| Resistor 26 | 680 ohms. |
| Capacitor 24 | 10 microfarads. |
| Resistor 28 | 100,000 ohms. |

The ratio of transformer winding 12*a*:12*b*:12*c*=1:3:1, and the supply voltage $V$=−10 volts. With the oscillator operating at a nominal frequency of 300 kilocycles, the frequency changed approximately 0.1% as the supply voltage was varied from −5 to −15 volts thereby indicating the excellent frequency stability obtained with the circuit.

Transistor 10 may be a type NPN instead of a type PNP if desired, in which case the polarity of diodes 20 and 22 and the supply voltage must be reversed. Also, the series resonant circuit 14 may comprise a crystal in lieu of the series inductance 16 and capacitor 18.

As many changes could be made in the above construction and many different embodiments could be made without departing from the scope thereof, it is intended that all matter contained in the above description or shown in the accompanying drawings, shall be interpreted as illustrative and not in a limiting sense.

What is claimed is:

1. A pulse oscillator comprising
(*a*) a transistor having emitter, base, and collector electrodes,
(*b*) a series resonant circuit having one end coupled to the emitter of said transistor,
(*c*) a transformer having at least first and second windings, the first winding of said transformer being coupled between the base of said transistor and the other end of said series resonant circuit, the second winding of said transformer having one end connected to the collector of said transistor and the other end adapted for connection to a voltage source,
(*d*) a first diode coupled between the emitter and base of said transistor, the direction of current flow through said first diode being opposite to the direction of current flow between emitter and base in said transistor, and
(*e*) switching means coupled across the second winding of said transformer, said switching means comprising a resistor and a capacitor connected in parallel and a second diode connected in series with said resistor and capacitor, said second diode being poled to conduct during substantially the same interval as said first diode, an output signal appearing across the windings of said transformer having a frequency determined by the resonant frequency of said series resonant circuit.

2. A pulse oscillator as defined in claim 1 wherein said transistor is a type PNP and wherein said first diode is poled to conduct current from the base to emitter electrodes of said transistor.

3. A pulse oscillator as defined in claim 1 wherein said series resonant circuit comprises a series connected inductance and capacitance.

4. A pulse oscillator comprising
(*a*) a transistor having emitter, base, and collector electrodes,
(*b*) a series resonant circuit having one end coupled to the emitter of said transistor,
(*c*) a transformer having first, second and third windings, the first winding being coupled between the base of said transistor and the other end of said series resonant circuit, the second winding having one end connected to the collector of said transistor and the other end adapted for connection to a voltage source, and the third winding being adapted for connection to an external load,
(*d*) a diode coupled between the emitter and base of said transistor, the direction of current flow through said diode being opposite to the direction of current flow between emitter and base in said transistor,
(*e*) switching means coupled across the second winding of said transformer, said switching means comprising a resistor and a capacitor connected in parallel and a second diode connected in series with said resistor and capacitor, said second diode being poled to conduct during substantially the same interval as said first diode, an output signal appearing across the third winding of said transformer having a frequency determined by the resonant frequency of said series resonant circuit.

References Cited in the file of this patent

UNITED STATES PATENTS

| | | |
|---|---|---|
| 2,521,376 | Keith-Murray | Sept. 5, 1950 |
| 3,026,487 | Walsh et al. | Mar. 20, 1962 |
| 3,038,128 | Fischman et al. | June 5, 1962 |
| 3,098,202 | Newell et al. | July 16, 1963 |

FOREIGN PATENTS

| | | |
|---|---|---|
| 206,471 | Austria | Dec. 10, 1959 |